United States Patent [19]

Coleman

[11] 4,240,004

[45] Dec. 16, 1980

[54] ULTRASONIC TRANSDUCER WITH CHEMICAL-SETTING INORGANIC CEMENT BACKING FOR OPERATION AT HIGH TEMPERATURES

[75] Inventor: Robert L. Coleman, Baltimore, Md.

[73] Assignee: Westinghouse Electric Corp., Pittsburgh, Pa.

[21] Appl. No.: 944,040

[22] Filed: Sep. 20, 1978

[51] Int. Cl.$^2$ ............................................ H01L 41/10

[52] U.S. Cl. .................................... 310/327; 29/25.35

[58] Field of Search ........................ 310/327, 336, 337; 29/25.35; 73/290 V, 642, 644, 609; 340/8 FT

[56] References Cited

U.S. PATENT DOCUMENTS

| | | | |
|---|---|---|---|
| Re. 29,785 | 9/1978 | Leschek et al. | 310/327 |
| 2,881,336 | 4/1959 | Elion | 310/327 |
| 3,189,767 | 6/1965 | Goldman et al. | 310/327 |

*Primary Examiner*—Mark O. Budd
*Attorney, Agent, or Firm*—D. Schron

[57] ABSTRACT

A transducer unit which includes a backing member formulated from a water activated ceramic to which is added a powdered metal.

5 Claims, 6 Drawing Figures

ULTRASONIC TRANSDUCER WITH CHEMICAL-SETTING INORGANIC CEMENT BACKING FOR OPERATION AT HIGH TEMPERATURES

BACKGROUND OF THE INVENTION

1. Field of the Invention

The present invention in general relates to transducers, and particularly to a novel backing member therefor for absorbing acoustic radiation.

2. Description of the Prior Art

Ultrasonic transducers find use in various fields such as medical diagnosis, flaw detection, and flow measurement systems, to name a few.

A common type of transducer includes an elongated housing or holder having at one end thereof an acoustic window for transmission of acoustic energy and behind which is positioned an active transducer element. The front surface of the active element transmits and receives acoustic energy through the acoustic window and a backing mass is generally disposed behind the rear surface of the active element in order to absorb rearwardly projected acoustic energy.

The backing mass, or damping block, is in intimate contact with the rear surface of the active element and in order to provide for good acoustic coupling so as to reduce acoustic reflections, it is desirable that the backing mass have an acoustic impedance closely matching that of the transducer active element.

Various types of backing masses have been proposed including solid materials such as tungsten metal or graphite as well as mixtures of materials such as metal powder mixed with synthetic resin or metal powder mixed with an elastomeric compound. In order to insure for a good bond between the backing member and active element, the two members are adhesively connected together.

As opposed to the solid backing masses, the metal powder-filler combinations may be tailored to provide different acoustic impedances by varying the mixtures thereof. These transducers operate satisfactorily under normal operating conditions, however, they are quite unsuitable for high temperature, high pressure operations such as may be found, for example, in an acoustic flow measurement system of an atomic reactor primary or secondary loop. Prior art mixtures do not function properly above approximately 71° C. (160° F.), and further at elevated temperatures, the adhesive bonding material is severely affected.

SUMMARY OF THE INVENTION

The arrangement of the present invention has been tested up to approximately 650° C. at a pressure of 10,000 psi and was found to exhibit satisfactory results. The transducer arrangement includes an active transducer element having front and rear active surfaces with a backing member abutting the rear surface. The backing member is comprised of a chemical-setting inorganic cement powder mixed with a powdered metal and to which water has been added to bring about a chemical reaction resulting in a solidification of the mixture, with the mixture being suitably dried and thereafter baked. In an arrangement which includes a transducer housing or holder, the watered blend of cement powder and powdered metal may be poured directly onto the back surface of the transducer element while in position within the holder, thus eliminating the requirement for machining to size while eliminating the need for an organic (adhesive) interface.

DESCRIPTION OF THE PREFERRED EMBODIMENT

Figure 1:
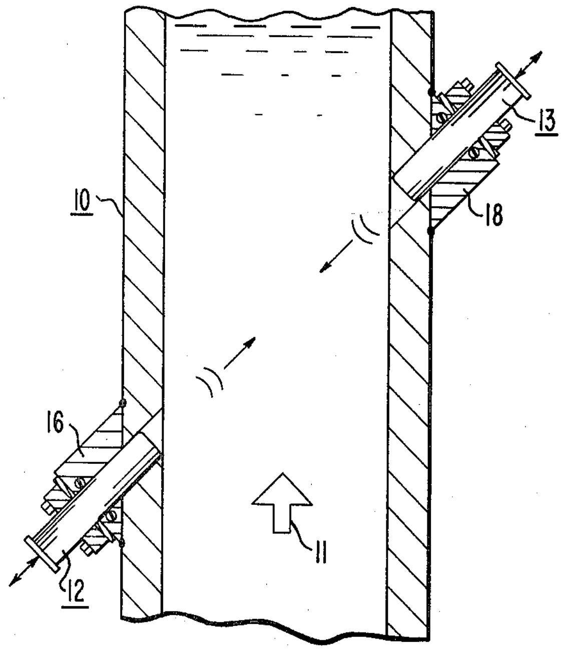
FIG. 1 is a sectional view of flowmeter apparatus in which the present invention is applicable.

FIG. 1 illustrates by way of example one environment in which the present invention may be utilized. In FIG. 1 pipe section 10 has a fluid contained therein flowing in the direction of the arrow 11. Opposed transducer units 12 and 13 are positioned within apertures in pipe section 10 for the projection of acoustic energy toward one another. Signal transfer with the transducer units are indicated by the double-ended arrows.

Each transducer unit 12 and 13 is secured to a respective extension or boss member 16 and 18 welded to the pipe section 10.

The fluid in pipe section 10 may be at temperatures of several hundreds of degrees centigrade and may be at a pressure of thousands of pounds per square inch, such as may be encountered in chemical processing or nuclear reactor plants. Under such adverse conditions, the transducer units must function properly to transmit and receive acoustic pulses so that accurate flow measurements of the flowing liquid may be obtained.

Figure 2:
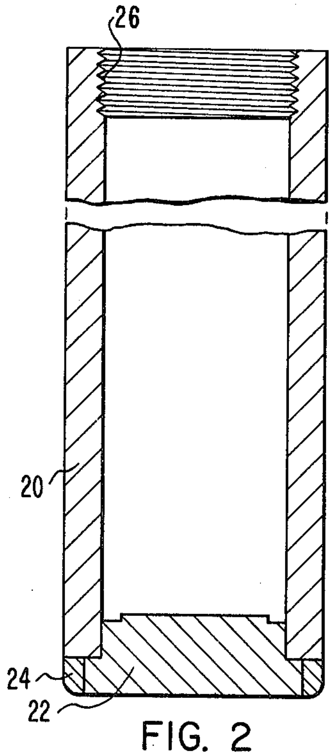
FIG. 2 is a sectional view through a typical transducer holder or housing.

A typical transducer unit includes a cylindrical holder 20, illustrated in FIG. 2, having at one end thereof a relatively thick acoustic window 22 secured to the cylindrical member 20 such as by a weld 24. The opposite end of holder 20 has a threaded surface 26 for reception of an end cap.

Figure 3:
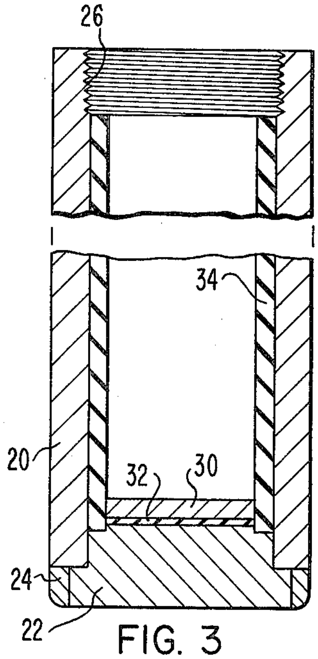
FIG. 3 is a view as in FIG. 2 of some insulating members and the transducer active element.

For high temperature-high pressure applications, the acoustic window 22 may be of a metal such as stainless steel and FIG. 3 illustrates a transducer active element 30 positioned within the holder 20 and just behind the acoustic window 22. In order not to have metallic acoustic window 22 touch the silvered active front surface of active element 30, there is interposed between the window and active element a thin disc of insulating material 32, alumina being one example. Similarly, to electrically insulate the active element from the cylindrical side walls of holder 20 a cylindrical insulator 34, such as a polyamide sleeve is provided. Such insulators can readily withstand the high temperatures encountered by the transducer unit and the active element 30 itself may be of a lead metiobate transducer material.

Figure 4:
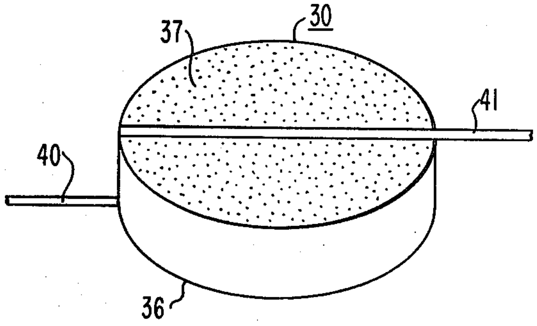
FIG. 4 is a view of the active element of FIG. 3.

The active element 30 is further illustrated in FIG. 4 and it is seen that it is a cylindrical disc having active surfaces 36 and 37, properly silvered and to which are connected respective flexible transducer leads 40 and 41.

The backing mass for the transducer unit may be cast in place and is formulated from a mixture of a chemical-setting inorganic cement dry powder material to which is added nickel powdered metal. One example of modified-silicate base cement material which may be utilized can be obtained from the Sauereisen Cement Company of Pittsburgh, PA, under the designation of Sauereisen No. 33. A suitable nickel metal powder may be obtained from the Fischer Scientific Company of Fair Lawn, NJ under the designation of N-40. Various ratios of metal to ceramic may be utilized depending upon such factors as the desired acoustic impedance, such acoustic impedance being determinable by techniques well known to those skilled in the art.

By way of example, water is added to the dry powder cement material and thereafter the nickel powdered metal is blended with the material, with a typical formulation being in the ratio of 1½ to 2 parts nickel metal powder to 1 part powder cement material. The addition of the water initiates a chemical reaction in the cement powder, resulting in the ultimate solidification of the blend.

Figure 5:
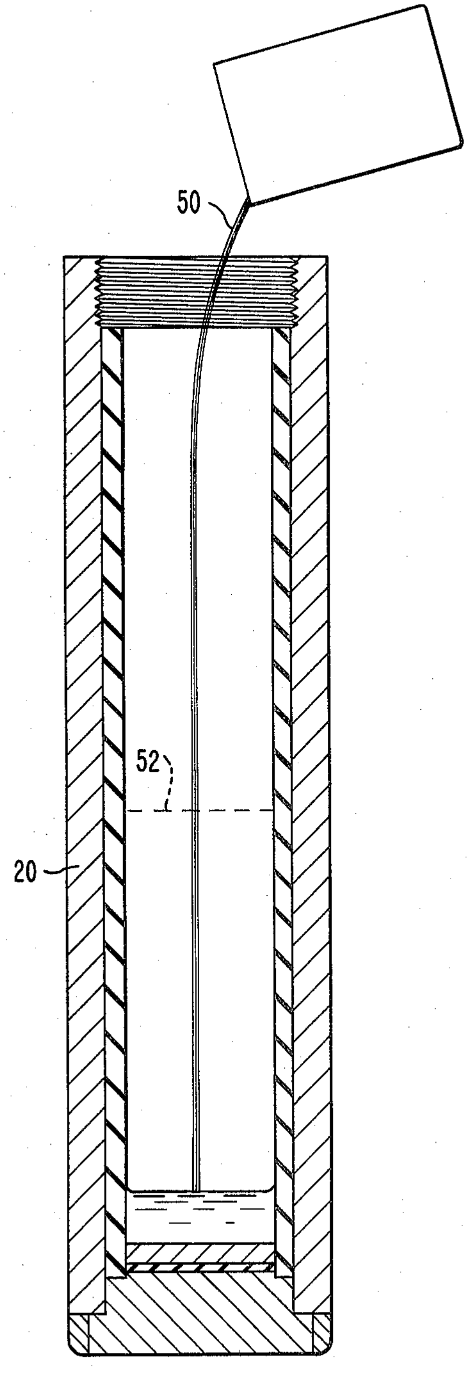
FIG. 5 is a view as in FIG. 3 illustrating the introduction of the backing member.
Figure 6:
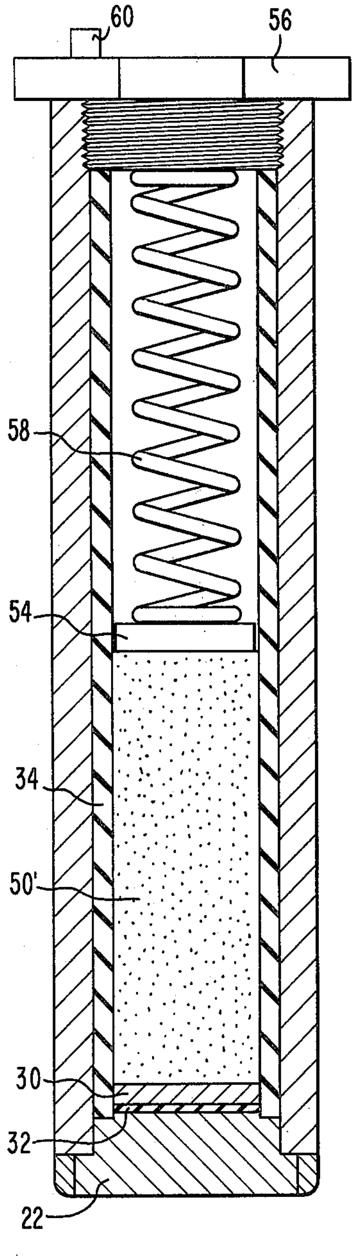
FIG. 6 is a cross sectional view through the transducer unit as it may be used in the environment of FIG. 1.

As illustrated in FIG. 5, the blended material while still undergoing the chemical reaction 50 may be poured directly into the holder 20 up to a level as indicated by the dotted line 52. The assembly thereafter is left standing at room temperature until the major portion of the water has evaporated, 24 hours being a representative time. After the evaporation process, the assembly is then baked at a temperature of approximately 66° C. for 24 hours until the blend is cured. After the baking process, and as illustrated in FIG. 6, a solid transducer backing member 50' is formed and the transducer unit may be completed with the inclusion of a back plate 54 and end cap 56 with a spring member 58 therebetween operable to ensure tight engagement between the various members lined up behind acoustic window 22. Suitable electrical leads (not shown) may be brought up through suitable channels in cylindrical insulator 34 to a connector 60 on end cap 56.

Although not illustrated, the process step as depicted in FIG. 5 may be followed by placement of the unit in a vacuum chamber so as to draw off any air that may be entrapped in the blend. Additionally, if desired, the arrangement may be placed in a hydraulic press so as to compress the blended mixture for air removal and to enhance the intimate union of the backing member and active element.

It is seen therefore that the materials utilized herein result in a transducer assembly applicable for high pressure and high temperature environments. The backing member is cast directly onto the active element, eliminating the need for an adhesive and eliminating the need for machining and precision dimensioning.

I claim:

1. A transducer for high temperature operation comprising:

(a) an active transducer element having front and rear active surfaces;

(b) a backing member abutting said rear surface;

(c) said backing member comprising a chemical-setting inorganic cement powder blended with a powdered metal and to which water has been added to bring about a chemical reaction resulting in the solidification of the blend, the blend being suitably dried and thereafter baked.

2. Apparatus according to claim 1 wherein:

(a) the ratio of powdered metal to cement powder is approximately 1½ to 2 parts metal powder to 1 part cement powder.

3. Apparatus according to claim 1 wherein:

(a) said powdered metal is nickel.

4. Apparatus according to claim 1 which includes:

(a) an elongated holder having an acoustic window at one end thereof;

(b) said active transducer element being positioned adjacent said acoustic window with a relatively thin electrically insulating disc interposed between said active element and said acoustic window;

(c) said blend cast directly on said active element in said holder.

5. Apparatus according to claim 1 wherein:

(a) said cement powder is a modified-silicate base cement.

* * * * *